US012598953B2

(12) United States Patent
Kakinuma

(10) Patent No.: US 12,598,953 B2
(45) Date of Patent: Apr. 7, 2026

(54) PROTECTIVE MEMBER FORMING APPARATUS AND METHOD OF FORMING PROTECTIVE MEMBER

(71) Applicant: DISCO CORPORATION, Tokyo (JP)

(72) Inventor: Yoshinori Kakinuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 580 days.

(21) Appl. No.: 17/814,617

(22) Filed: Jul. 25, 2022

(65) Prior Publication Data

US 2023/0050520 A1 Feb. 16, 2023

(30) Foreign Application Priority Data

Aug. 12, 2021 (JP) ................................. 2021-131704

(51) Int. Cl.
*H10P 72/70* (2026.01)
*H10P 72/00* (2026.01)
*H10W 74/01* (2026.01)

(52) U.S. Cl.
CPC .......... *H10P 72/74* (2026.01); *H10P 72/0428* (2026.01); *H10P 72/0448* (2026.01); *H10W 74/017* (2026.01)

(58) Field of Classification Search
CPC ........... H01L 21/6835; H01L 21/67132; H01L 2221/6834; H01L 21/566; H01L 21/67092
See application file for complete search history.

(56) References Cited

U.S. PATENT DOCUMENTS

| | | | | |
|---|---|---|---|---|
| 2012/0135096 A1* | 5/2012 | Maeyama | ............... | B29C 43/18 |
| | | | | 425/161 |
| 2018/0330938 A1* | 11/2018 | Sekiya | .................... | B24B 7/228 |
| 2020/0043754 A1* | 2/2020 | Namioka | ............ | H01L 21/6715 |
| 2022/0153009 A1* | 5/2022 | Nogami | .................. | B32B 37/10 |

FOREIGN PATENT DOCUMENTS

JP 2021027239 A 2/2021

* cited by examiner

*Primary Examiner* — Yara B Green
*Assistant Examiner* — Coralie A Nettles
(74) *Attorney, Agent, or Firm* — Greer Burns & Crain Ltd.

(57) ABSTRACT

A protective member forming apparatus includes a resin film adhering unit which causes a resin film to adhere to a front surface of a substrate so as to conform to recesses and projections on the front surface of the substrate, a support table which supports the substrate, a liquid resin supplying unit which supplies a curable liquid resin, a pressing unit which covers the liquid resin supplied to the resin film with a cover film and presses the cover film by a pressing surface to spread the liquid resin over the resin film, and a curing unit which cures the liquid resin being spread. The support table includes an annular bank region having a height not exceeding a thickness of the substrate and housing the substrate therein, and the bank region prevents the liquid resin to be spread by the pressing unit from flowing out from the substrate.

4 Claims, 7 Drawing Sheets

PROTECTIVE MEMBER FORMING APPARATUS AND METHOD OF FORMING PROTECTIVE MEMBER

BACKGROUND OF THE INVENTION

Field of the Invention

The present invention relates to a protective member forming apparatus and a method of forming the protective member.

Description of the Related Art

Device chips used in electronic equipment are manufactured by thinning a substrate from a back surface thereof, the substrate, such as silicon, formed with devices on a front surface thereof, dividing the substrate into individual device chips, and then supplying a molding resin for protecting each device onto the front surface of the substrate.

Meanwhile, each device has minute recesses and projections formed thereon due to a circuit pattern and the like, and particularly in a case in which bumps serving as electrodes are mounted on the front surface of the substrate, recesses and projections having a size of several ten micrometers or more are formed in the device. A back surface of such a substrate as described above may be ground or divided into individual pieces in a state in which an adhesive tape adheres to a front surface of the substrate formed with the devices in order to protect the devices.

In carrying out these grinding and dividing processes, when the recesses and projections on a device surface of the substrate have a large height difference, the adhesive tape cannot sufficiently accommodate the height difference of the recesses and projections. As a result, the recesses and projections may be transferred to a wafer having being ground, or cutting swarf caused by the dividing process enters a gap between the adhesive tape and the device. When an adhesive tape having an adhesive layer with a thickness enough to be able to accommodate the recesses and projections is used, a new problem that a residue of a glue of the adhesive layer remains on the device surface occurs.

In view of this, there has been conceived of a method of forming a protective member which can sufficiently accommodate such recesses and projections on the front surface of the wafer, the protective member including a sheet not having an adhesive layer adhering to the recesses and projections on the front surface of the wafer, and a curable liquid resin (for example, see Japanese Patent Laid-Open No. 2021-027239). This method makes it possible to eliminate a gap between the protective member and the recesses and projections of the devices, while preventing the residue of the adhesive layer from remaining on the wafer.

SUMMARY OF THE INVENTION

However, in this method described above, there is a new problem that, when pressing the liquid resin supplied on the sheet along the sheet adhering to the front surface of the substrate to spread the liquid resin over the sheet, the liquid resin in the vicinity of the outer periphery of the substrate flows out from the substrate, causing possible reduction in thickness of a layer of the liquid resin in the vicinity of the outer periphery of the substrate.

It is accordingly an object of the present invention to provide a protective member forming apparatus capable of preventing the liquid resin from flowing out from the substrate in spreading the liquid resin over the front surface of the substrate by pressing the liquid resin and a method of forming the protective member.

In accordance with an aspect of the present invention, there is provided a protective member forming apparatus that forms a protective member on a front surface of a substrate, the substrate having recesses and projections on the front surface thereof. The protective member forming apparatus includes a resin film adhering unit which causes a resin film to adhere to the front surface of the substrate so as to conform to the recesses and projections on the front surface of the substrate, a support table which supports the substrate in a state in which the resin film adhering to the substrate is exposed upward, a liquid resin supplying unit which supplies a curable liquid resin onto an upper surface of the resin film adhering to the substrate supported on the support table, a pressing unit which has a flat pressing surface, covers the liquid resin supplied to the resin film with a cover film, and presses the cover film by the pressing surface, to spread the liquid resin over the resin film, and a curing unit which cures the liquid resin being spread by the pressing unit, and forms a protective member including the resin film, the cured liquid resin, and the cover film on the front surface of the substrate. The support table includes an annular bank region having a height not exceeding a thickness of the substrate and housing the substrate therein, the bank region preventing the liquid resin to be spread by the pressing unit from flowing out from the substrate.

Preferably, the bank region includes an inclined surface on an upper surface of the bank region, and the inclined surface is higher from an inner periphery of the bank region toward an outer side thereof in a radial direction.

In accordance with another aspect of the present invention, there is provided a method of forming a protective member that forms a protective member on a front surface of a substrate, the substrate having recesses and projections on the front surface thereof. The method of forming a protective member includes a resin film adhering step of causing a resin film to adhere to the front surface of the substrate so as to conform to the recesses and projections on the front surface of the substrate, a substrate supporting step of supporting the substrate on a support table in a state in which the resin film adhering to the substrate is exposed upward, a liquid resin supplying step of supplying a curable liquid resin onto an upper surface of the resin film adhering to the substrate supported on the support table, a resin pressing step of covering the liquid resin supplied to the resin film with a cover film, and pressing the cover film by a flat pressing surface, to spread the liquid resin over the resin film, and a curing step of curing the liquid resin being spread in the resin pressing step, and forming a protective member including the resin film, the cured liquid resin, and the cover film on the front surface of the substrate. In the substrate supporting step, the substrate is supported on the support table which includes an annular bank region having a height not exceeding a thickness of the substrate and housing the substrate therein, causing the bank region to prevent the liquid resin to be spread in the resin pressing step from flowing out from the substrate.

According to one aspect and another aspect of the present invention, it is possible to prevent the liquid resin from flowing out from the substrate when the liquid resin is pressed and spread on the substrate.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment. Moreover, the components used in this preferred embodiment may include those that can easily be assumed by persons skilled in the art or substantially the same elements as those known in the art. Further, the configurations described below may be suitably combined. Further, the configurations may variously be omitted, replaced, or changed without departing from the scope of the present invention.

Embodiment

In a protective member forming apparatus 20 and a method of forming a protective member 15 according to the embodiment, the protective member 15 is formed on a front surface 2 of a substrate 1 such as a semiconductor wafer.
<Substrate 1>

Figure 1:
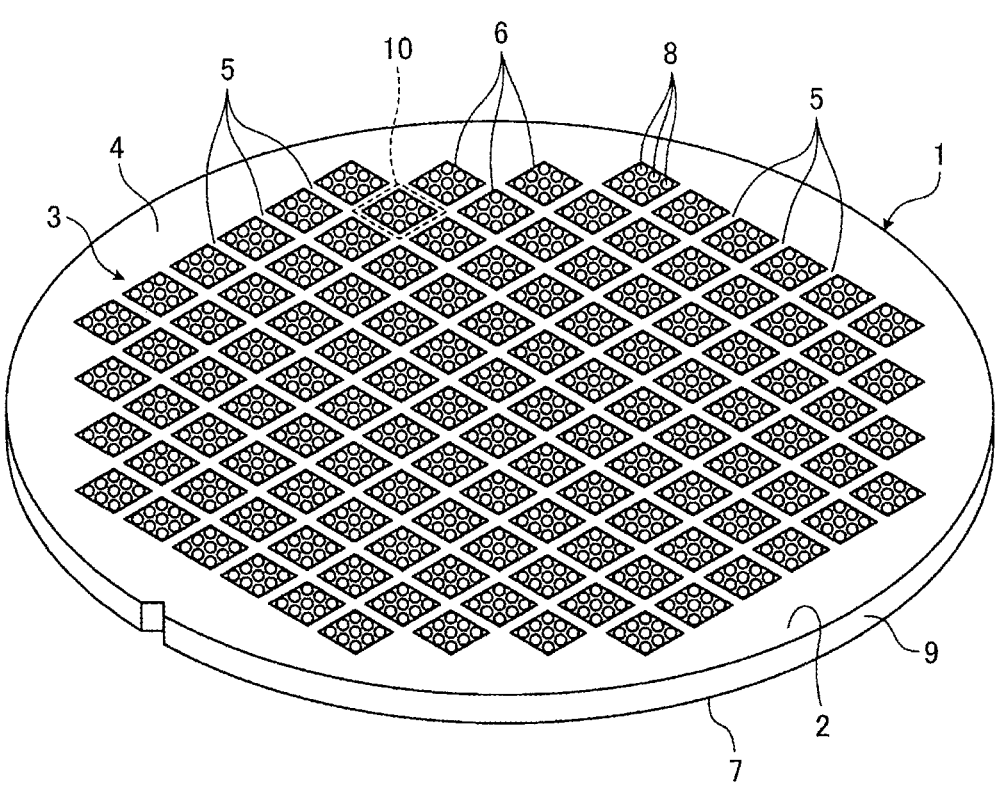
FIG. 1 is a perspective view depicting one example of a substrate on which a protective member is to be formed in a protective member forming apparatus and a method of forming the protective member according to a preferred embodiment.

First, the substrate 1 the front surface 2 of which the protective member 15 is formed will be described. FIG. 1 is a perspective view depicting one example of the substrate 1 on which the protective member 15 is to be formed in the protective member forming apparatus 20 and a method of forming the protective member 15 according to the preferred embodiment. The substrate 1 is, for example, a wafer such as a semiconductor wafer formed of a material such as silicon (Si), silicon carbide (SiC), gallium nitride (GaN), gallium arsenide (GaAs), or another semiconductor or an optical device wafer. Alternatively, the substrate 1 is a substantially disk-shaped substrate or the like formed of a material such as sapphire (Al$_2$O$_3$), glass, or quartz. The glass is, for example, alkali glass, non-alkali glass, soda-lime glass, lead glass, borosilicate glass, quartz glass, or the like.

The substrate 1 includes a device region 3 and a peripheral surplus region 4 on the front surface 2 side. The device region 3 has devices 6 formed in respective regions demarcated by a plurality of crossing dividing lines 5 including a plurality of parallel dividing lines extending in a first direction and a plurality of parallel dividing lines 5 extending in a second direction perpendicular to the first direction in a grid manner, the dividing lines 5 being formed on the front surface 2 of the substrate 1. The device 6 is, for example, an integrated circuit such as an integrated circuit (IC) or large-scale integration (LSI), an image sensor such as a charge coupled device (CCD) or a complementary metal oxide semiconductor (CMOS), micro electro mechanical systems (MEMS), or the like. The peripheral surplus region 4 is a region that surrounds the whole device region 3 and that is not formed with the devices 6.

A back surface 7 of the substrate 1 positioned on an opposite side of the front surface 2 formed with the devices 6 is ground to a finished thickness by a grinding apparatus, for example. For example, the substrate 1 is thinned first and then divided into individual device chips 10 along the dividing lines 5 by cutting or the like. Note that the device chips 10 are each a square shape in FIG. 1 but may be a rectangular shape.

The substrate 1 has a plurality of bumps 8 formed on the front surface 2 side, the bumps 8 being projected portions projecting from a front surface of each of the devices 6. The substrate 1 includes recesses and projections on the front surface 2 thereof due to mounting of the bumps 8. The plurality of bumps 8 are electrically connected to the respective devices 6, and each of the bumps 8 functions as an electrode at a time of inputting or outputting an electric signal to the device 6, in a state in which the device chips 10 are formed by dividing the substrate 1. The bumps 8 are, for example, formed of a metallic material such as gold, silver, copper, or aluminum. Note that the substrate 1 has recesses and projections formed on the front surface 2 thereof due to the mounting of the bumps 8 in this embodiment. However, in the present invention, the bumps 8 may not necessarily be mounted on the front surface 2 of the substrate 1, and it is sufficient if the recesses and projections are formed on the front surface 2 side.

Note that the substrate 1 on which the protective member 15 is formed is not limited to this embodiment. For example, the substrate 1 on which the protective member 15 is formed may be a package substrate. The package substrate has a plurality of bumps serving as electrodes of individual devices formed on a front surface thereof and is formed by sealing a plurality of devices arranged on a flat surface with a sealing resin. The package substrate is thinned by grinding the sealing resin on the back surface side of the package substrate, and the package substrate is thus divided on a device-by-device basis. As a result, the package substrate is divided into individual device chips 10 each having a predetermined thickness which device chips are sealed by the sealing resin.
<Protective Member Forming Apparatus 20>

Figure 2:
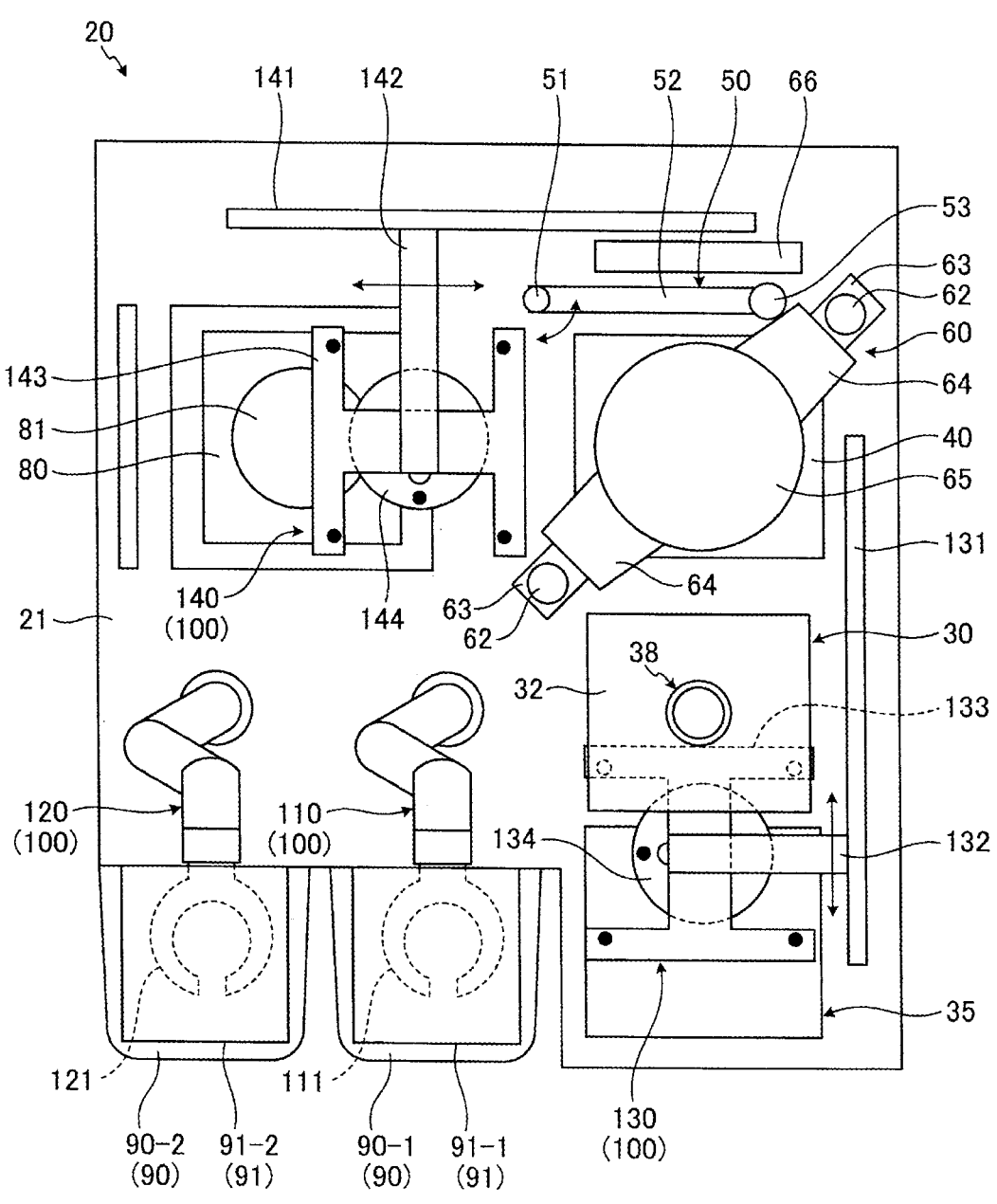
FIG. 2 is a plan view depicting a configuration example of the protective member forming apparatus according to the embodiment.
Figure 3:
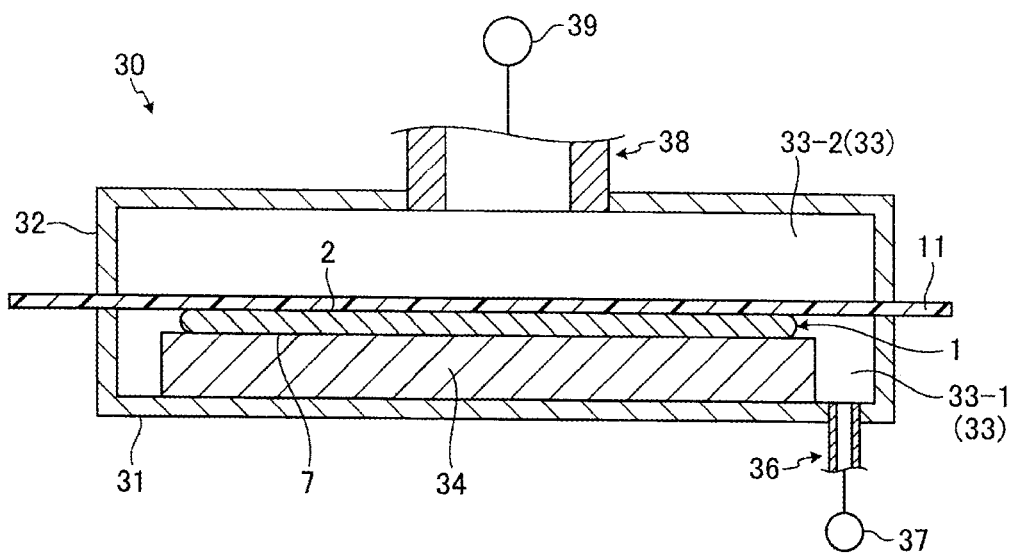
FIG. 3 is a cross-sectional view schematically depicting a resin film adhering unit of the protective member forming apparatus depicted in FIG. 2.
Figure 4:
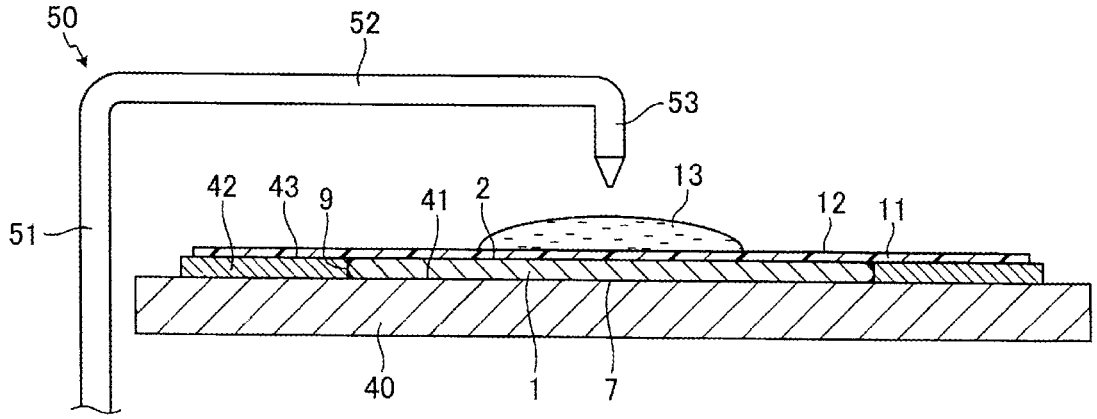
FIG. 4 is a cross-sectional view schematically depicting a support table and a liquid resin supplying unit of the protective member forming apparatus depicted in FIG. 2.
Figures 5, 6:
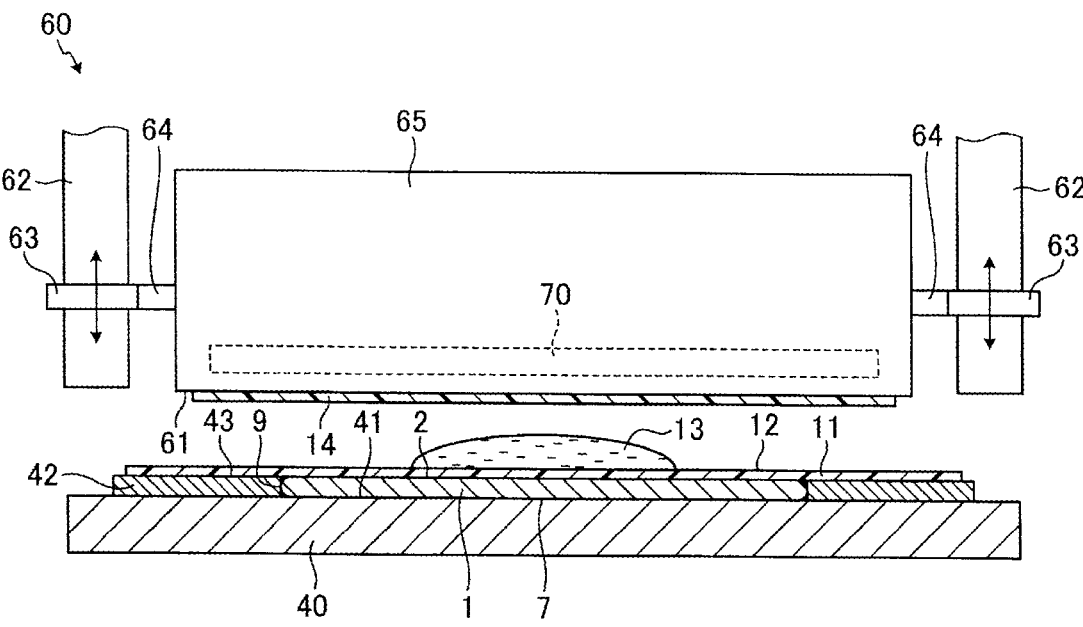
FIG. 5 is a cross-sectional view schematically depicting the support table, a pressing unit, and a curing unit of the protective member forming apparatus depicted in FIG. 2.
FIG. 6 is a cross-sectional view schematically depicting another state of FIG. 5.

Next, the protective member forming apparatus 20 that forms the protective member 15 on the substrate 1 will be described. FIG. 2 is a plan view depicting a configuration example of the protective member forming apparatus 20 according to the embodiment. FIG. 3 is a cross-sectional view schematically depicting a resin film adhering unit 30 of the protective member forming apparatus 20 depicted in FIG. 2. FIG. 4 is a cross-sectional view schematically depicting a support table 40 and a liquid resin supplying unit 50 of the protective member forming apparatus 20 depicted in FIG. 2. FIG. 5 is a cross-sectional view schematically depicting the support table 40, a pressing unit 60, and a curing unit 70 of the protective member forming apparatus 20 depicted in FIG. 2. FIG. 6 is a cross-sectional view schematically depicting another state of FIG. 5.

As depicted in FIG. 2, the protective member forming apparatus 20 includes a base 21 supporting each constituent element. The protective member forming apparatus 20 includes the resin film adhering unit 30, the support table 40, the liquid resin supplying unit 50, the pressing unit 60, the curing unit 70, a cassette mounting base 90, and a transfer unit 100.

The resin film adhering unit 30 causes the resin film 11 depicted in FIG. 3 to adhere to the front surface 2 of the substrate 1 so as to conform to the recesses and projections on the front surface 2 of the substrate 1. The resin film 11 includes, for example, a polyolefin-based sheet, a polyethylene-based sheet, or the like that has a thickness of equal to or more than 20 μm and equal to or less than 80 μm. The resin film 11 may be a single layer or laminated. As depicted in FIG. 2 and FIG. 3, the resin film adhering unit 30 has a lower main body 31 in a hollow-shaped box member opening upward, an upper main body 32 in a hollow-shaped cover member that is disposed over the lower main body 31 and that opens downward, a chuck table 34, a resin film supplying unit 35, and exhaust units 36 and 38.

An opening of the lower main body 31 and an opening of the upper main body 32 are of the same shape and larger than the substrate 1. The upper main body 32 can be moved up and down vertically to the lower main body 31, and when the upper main body 32 is lowered to the lower main body 31 such that the openings coincide with each other, a space 33 isolated from the outside can be formed within the upper main body 32 and the lower main body 31. In other words, in the embodiment, the resin film adhering unit 30 is configured in such a chamber-like shape as to house the substrate 1 in the internal space 33.

The chuck table 34 is provided on a bottom wall of the lower main body 31. The chuck table 34 has a flat holding surface on its upper surface so as to support the substrate 1 on the holding surface. When the substrate 1 is placed on the holding surface of the chuck table 34, a height of the front surface 2 of the substrate 1 is adjusted so as to be substantially the same as a height of the opening of the lower main body 31 or lower than the height of the opening of the lower main body 31. By adjusting the height of the chuck table 34 in this manner, when the resin film 11 is placed on the lower main body 31 as described below so as to make the resin film 11 adhere to the substrate 1, the resin film 11 is prevented from unnecessarily widely adhering to side surfaces of the substrate 1.

The resin film supplying unit 35 supplies the resin film 11. The resin film supplying unit 35 is provided at a position adjacent to the lower main body 31 and the upper main body 32. More specifically, the resin film supplying unit 35 is provided such that the resin film supplying unit 35, the lower main body 31 and the upper main body 32, and the support table 40 to be described later are arranged in line. The resin film supplying unit 35 has a plurality of resin films 11 prepared therein. The plurality of resin films 11 prepared in the resin film supplying unit 35 are transferred onto the front surface 2 of the substrate 1 held on the holding surface of the chuck table 34, by the transfer unit 100 to be described later, one by one.

When the resin film 11 covers the front surface 2 of the substrate 1 held on the holding surface of the chuck table 34 and the upper main body 32 is lowered to the lower main body 31 such that the openings coincide with each other, the resin film 11 defines the space 33 into a space 33-1 on the lower main body 31 side and a space 33-2 on the upper main body 32 side. Specifically, the resin films 11 larger than the opening of the lower main body 31 are prepared in the resin film supplying unit 35 such that the space 33-1 closed by the lower main body 31 and the resin film 11 is formed. After the resin film 11 is transferred to the front surface 2 of the substrate 1, the upper main body 32 is lowered to the lower main body 31, and the opening of the upper main body 32 is brought into contact with an upper surface 12 of the resin film 11, so that the space 33-2 closed by the upper main body 32 and the resin film 11 is formed.

The exhaust unit 36 includes an exhaust passage having one end connected to a side wall or the bottom wall of the lower main body 31 and having another end connected to a suction source 37. The exhaust unit 36 can exhaust the air from the space 33-1 surrounded by the lower main body 31 and the resin film 11 covering the substrate 1 and decompress the space 33-1. The exhaust unit 38 includes an exhaust passage having one end connected to a side wall or a ceiling of the upper main body 32 and having another end connected to a suction source 39. The exhaust unit 38 can exhaust the air from the space 33-2 surrounded by the lower main body 31 and the resin film 11 covering the substrate 1 and decompress the space 33-2.

Moreover, in the resin film adhering unit 30, a heating unit which can supply a heated gas to the space 33-2 may be connected to the side wall or the ceiling of the upper main body 32. The gas is, for example, air, nitrogen gas, or the like. In a case where a material whose flexibility is enhanced by heating is used as the resin film 11, for example, when the heated air is supplied to the space 33-2, the heated air increases the temperature of the resin film 11 and thus softens the resin film 11. When the resin film 11 is softened, the resin film 11 is easily deformed so as to follow the shape of the front surface 2 of the substrate 1, and the resin film 11 adheres to the front surface 2 of the substrate 1 easily. The resin film adhering unit 30 may be configured such that, in order to heat and soften the resin film 11 such that the resin film 11 adheres to the substrate 1 easily, the chuck table 34 includes a heat source such that the resin film 11 is heated through the substrate 1 by the holding surface heated by the heat source.

As depicted in FIG. 4, the support table 40 supports the substrate 1 in a state in which the resin film 11 adhering to the substrate 1 is exposed upward. The support table 40 is provided at a position adjacent to the resin film adhering unit 30 on the base 21. The substrate 1 to which the resin film 11 is caused to adhered by the resin film adhering unit 30 is transferred from the resin film adhering unit 30 to the support table 40 by the transfer unit 100 to be described later.

The support table 40 includes an annular bank region 42 around a supporting surface 41 supporting the substrate 1. The substrate 1 is housed inside the bank region 42. In other words, the bank region 42 surrounds the substrate 1 supported by the supporting surface 41. An upper surface 43 of the bank region 42 is at least higher than the supporting surface 41 and has a height not exceeding a thickness of the substrate 1. The upper surface 43 of the bank region 42 supports a portion of the resin film 11 covering the substrate 1 which portion is located outside the peripheral edge 9 of the substrate 1.

With the substrate 1 being supported by the support table 40, the liquid resin supplying unit 50 to be described later supplies a liquid resin 13 to the upper surface 12 of the resin film 11 adhering to the front surface 2 side. Also, the liquid resin 13 supplied on the upper surface 12 of the resin film 11 is covered by a cover film 14 and pressed from above by the pressing unit 60 to be described later to be spread over the resin film 11. Also, the spread liquid resin 13 is cured by the curing unit 70 to be described later.

The bank region 42 supports the portion of the resin film 11 covering the substrate 1 which portion is located outside the peripheral edge 9 of the substrate 1, and accordingly, when the liquid resin 13 is pressed from above by the pressing unit 60 to be described later, the liquid resin 13 that is pressed and spread onto the resin film 11 is prevented from flowing out from the substrate 1.

More specifically, in order to prevent the liquid resin 13 from flowing out from the substrate 1, the height of the upper surface 43 of the bank region 42 may be desirably set to be same as the height of the substrate 1 in design. However, in practice, the thickness of the substrate 1 is varied by substantially several hundred micrometers, the height of the upper surface 43 of the bank region 42 may be smaller by substantially several hundred micrometers than the thickness of the substrate 1.

The liquid resin supplying unit 50 supplies the curable liquid resin 13 on the upper surface 12 of the resin film 11 adhering to the substrate 1 supported by the support table 40. The curable liquid resin 13 is an ultraviolet curable resin curable by being irradiated with ultraviolet rays in the embodiment but may be a thermosetting resin curable by heating, for example, in the present invention. The liquid resin supplying unit 50 is provided at a position adjacent to the support table 40 of the base 21.

In the embodiment, the liquid resin supplying unit 50 is a pipe-shaped unit including a shaft portion 51 extending along a vertical direction, an arm portion 52 extending in a horizontal direction from an upper end of the shaft portion 51, and a nozzle 53 oriented downward from a distal end of the arm portion 52. The shaft portion 51 is rotatable in the vertical direction. In the liquid resin supplying unit 50, when the shaft portion 51 is rotated, the nozzle 53 moves in an arcuate orbit with the arm portion 52 as a radius. A length of the arm portion 52 is set to be such a length that the nozzle 53 can be positioned above the center of the support table 40 by rotation of the shaft portion 51.

As depicted in FIG. 5 and FIG. 6, the pressing unit 60 covers the liquid resin 13 supplied onto the resin film 11 with the cover film 14 and presses the cover film 14 with a flat pressing surface 61, so that the liquid resin 13 is spread over the resin film 11 by being pressed from above. The cover film 14 is a member constituting the protective member 15, as well as the resin film 11 and the liquid resin 13. The pressing unit 60 is provided above the support table 40. The pressing unit 60 includes a pair of supporting columns 62, a pair of connecting portions 63, a pair of supporting portions 64, a pressing portion 65 including the pressing surface 61, and a cover film supplying unit 66.

The pair of supporting columns 62 extends along the vertical direction. The pair of connecting portions 63 can be raised and lowered in the vertical direction along the supporting columns 62 by an unillustrated raising and lowering mechanism. The pair of supporting portions 64 extends from the connecting portions 63 in the horizontal direction. The pressing portion 65 is supported by the pair of supporting portions 64. The pressing portion 65 includes the pressing surface 61 as its lower surface. Orientation of the pressing surface 61 is set to be in parallel to the supporting surface 41 of the support table 40 with high accuracy. The pressing portion 65 can hold the cover film 14 on the pressing surface 61.

The pressing portion 65 may include an unillustrated holding mechanism, for holding the cover film 14 on the pressing surface 61. The holding mechanism includes, for example, a suction hole provided in the pressing surface 61 and a suction source connected to the suction hole, and the cover film 14 may be held on the pressing surface 61 by being sucked from the suction hole. In addition, the holding mechanism may have, for example, an electrostatic chuck mechanism provided in the vicinity of the pressing surface 61 and hold the cover film 14 on the pressing surface 61 through an electrostatic force.

Incidentally, the pressing portion 65 may not necessarily include the holding mechanism. In a case in which the pressing portion 65 does not include the holding mechanism, for example, a glue layer may be provided on an upper surface of the cover film 14 and the cover film may be bonded to the pressing surface 61 through the glue layer, or by applying an adhesive to the upper surface of the cover film 14 or to the pressing surface 61, the cover film 14 may be bonded to the pressing surface 61 through the adhesive.

The cover film supplying unit 66 (see FIG. 2) supplies the cover film 14. The cover film supplying unit 66 is provided at a position adjacent to the support table 40. The cover film supplying unit 66 has a plurality of cover films 14 prepared therein. The plurality of cover films 14 prepared in the cover film supplying unit 66 are loaded onto the support table 40 one by one, as needed, and the pressing portion 65 is lowered such that the upper surface of the cover film 14 loaded is brought into contact with the pressing surface 61, so that the cover film 14 is held on the pressing surface 61.

As depicted in FIG. 6, the pressing portion 65 moves up and down in the vertical direction along with the connecting portions 63 and the supporting portions 64, according to vertical movement of the connecting portions 63 with respective to the supporting columns 62. The pressing portion 65 is lowered to the support table 40 in a state in which the cover film 14 is held on the pressing surface 61, so that the liquid resin 13 is covered with the cover film 14 on the resin film 11 covering the substrate 1 supported by the support table 40. The pressing portion 65 is further lowered, so that the liquid resin 13 is pressed from above through the cover film 14 with the pressing surface 61 to be spread over the resin film 11.

The curing unit 70 cures the liquid resin 13 being pressed and spread by the pressing unit 60, and accordingly, the protective member 15 including the resin film 11, the cured liquid resin 13, and the cover film 14 is formed on the front surface 2 of the substrate 1. The curing unit 70 is provided at a position in the vicinity of the pressing surface 61 in the pressing portion 65 of the pressing unit 60.

As in the embodiment, in a case in which the liquid resin 13 is an ultraviolet curable resin curable by being irradiated with ultraviolet rays, the curing unit 70 includes a plurality of ultraviolet light-emitting diodes (LEDs) or the like that apply the ultraviolet rays to the liquid resin 13 that has been pressed and spread. In this case, a lower end of the pressing portion 65 including the pressing surface 61 is formed of a member allowing the ultraviolet rays to pass therethrough. Note that, for example, in a case in which the liquid resin 13 is a thermosetting resin curable by heating, the curing unit 70 includes a heater or the like which heats the liquid resin 13 that has been pressed and spread.

In the protective member forming apparatus 20, the protective member 15 formed on the front surface 2 of the substrate 1 is, for example, transferred by the transfer unit 100 to be described later, from the support table 40 onto a supporting surface 81 of another support table 80, and an unnecessary portion of the protective member 15 outside the peripheral edge 9 of the substrate 1 is cut by an unillustrated cutting unit. Thus, the unnecessary portion of the protective member 15 is cut by the unillustrated cutting unit, and accordingly, the substrate 1 is put into a state in which grinding processing of the back surface 7 is enabled.

As depicted in FIG. 2, the cassette mounting base 90 is provided at an end of the base 21. On the cassette mounting base 90, a cassette 91 housing a plurality of substrates 1 is placed. In the protective member forming apparatus 20 of the embodiment, two cassette mounting bases 90-1 and 90-2 are provided. The substrate 1 on which the protective member 15 has not been formed yet is housed, for example, in the cassette 91-1 carried on the cassette mounting base 90-1, and is loaded in the protective member forming apparatus 20. The substrate 1 having the protective member 15 formed on the front surface 2 thereof in the protective member forming apparatus 20 is, for example, housed in the cassette 91-2 carried on the cassette mounting base 90-2, and is unloaded from the protective member forming apparatus 20.

The transfer unit 100 of the embodiment includes substrate transfer robots 110 and 120 and linear motion transfer units 130 and 140. The substrate transfer robots 110 and 120 are each, for example, an articulated robot having a plurality of arm portions continuously connected to each other so as to be rotatable on mutual end portions. The substrate transfer robots 110 and 120 of the embodiment can hold the substrate 1 by holding portions 111 and 121 provided at respective distal ends of the arm portions on the most distal end side, and the holding portions 111 and 121 can be moved when the arm portions are rotated with each other.

The substrate transfer robot 110 is provided at a position adjacent to the cassette mounting base 90-1 on the base 21. The substrate transfer robot 110 inserts the holding portion 111 into the cassette 91-1 placed on the cassette mounting base 90-1, for example, and unloads a predetermined one of the housed substrates 1 to transfer the substrate 1 to the resin film adhering unit 30. The substrate transfer robot 120 is provided at a position adjacent to the cassette mounting base 90-2 on the base 21. The substrate transfer robot 120 unloads the substrate 1 from the support table 80, for example, and inserts the holding portion 121 in the cassette 91-2 placed on the cassette mounting base 90-2 to load and house the substrate 1 therein.

The linear motion transfer unit 130 transfers the resin film 11 from the resin film supplying unit 35 of the resin film adhering unit 30 onto the lower main body 31 and the chuck table 34. The linear motion transfer unit 130 transfers the substrate 1 to which the resin film 11 is caused to adhere by the resin film adhering unit 30, in a state in which a portion of the resin film 11 outside the peripheral edge 9 of the substrate 1 is spread, from the chuck table 34 to the support table 40. The linear motion transfer unit 140 transfers the substrate 1 on which the protective member 15 is formed, from the support table 40 to the support table 80.

The linear motion transfer units 130 and 140 include guide rails 131 and 141, arm portions 132 and 142, base portions 133 and 143, suction pad supporting portions 134 and 144, unillustrated moving mechanisms, respectively. The guide rails 131 and 141 extend in a direction in which the substrate 1 is transferred. The arm portions 132 and 142 can move along the guide rails 131 and 141. The base portions 133 and 143 are fixed to distal ends of the arm portions 132 and 142. A plurality of suction pads are fixed to each of lower surfaces of outer peripheral portions of the base portions 133 and 143. The suction pad supporting portions 134 and 144 are fixed to respective central lower surfaces of the base portions 133 and 143. A plurality of noncontact type suction pads are fixed to each of lower surfaces of the suction pad supporting portions 134 and 144. The moving mechanisms cause the arm portions 132 and 142 to move together with the base portions 133 and 143 and the suction pad supporting portions 134 and 144 along the guide rails 131 and 141.

<Method of Forming Protective Member 15>

Figure 7:
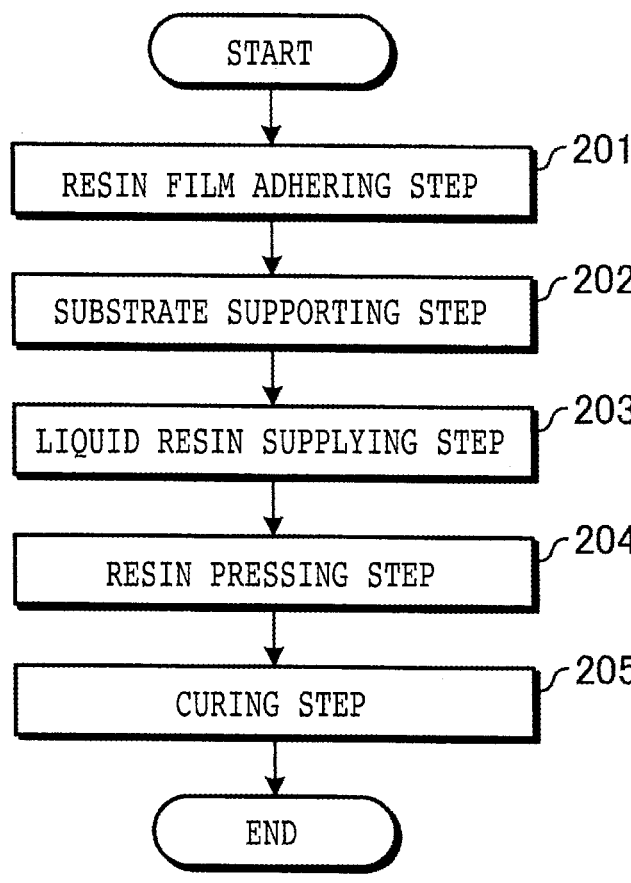
FIG. 7 is a flow chart of a method of forming the protective member according to the embodiment.

Next, a method of forming the protective member 15 according to the embodiment will be described. FIG. 7 is a flow chart indicating a flow of the method of forming the protective member 15 according to the embodiment. The method of forming the protective member 15 according to the embodiment includes a resin film adhering step 201, a substrate supporting step 202, a liquid resin supplying step 203, a resin pressing step 204, and a curing step 205.

Figure 8:
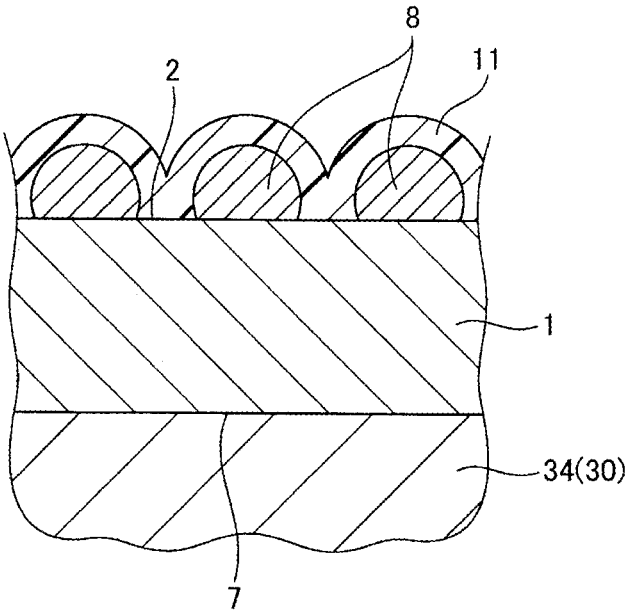
FIG. 8 is an enlarged view schematically depicting a cross-section of the substrate that has undergone a resin film adhering step indicated in FIG. 7.

FIG. 8 is an enlarged view schematically depicting a cross-section of the substrate 1 that has undergone the resin film adhering step 201 indicated in FIG. 7. The resin film adhering step 201 is a step of causing the resin film 11 to adhere to the front surface 2 of the substrate 1 so as to conform to the recesses and projections (bumps 8) on the front surface 2 of the substrate 1. The resin film adhering step 201 in the embodiment is carried out by the resin film adhering unit 30 depicted in FIG. 2 and FIG. 3.

In the resin film adhering step 201, first, in a state in which the upper main body 32 of the resin film adhering unit 30 is raised, one of the substrates 1 in the cassette 91-1 carried on the cassette mounting base 90-1 is held by the substrate transfer robot 110. Then, the substrate transfer robot 110 loads the held substrate 1 onto the holding surface of the chuck table 34 in the lower main body 31. At this time, the front surface 2 having the recesses and projections is directed upward, and the substrate 1 is loaded such that the back surface 7 side faces the holding surface of the chuck table 34.

In the resin film adhering step 201, next, the linear motion transfer unit 130 takes one of the resin films 11 out from the resin film supplying unit 35, and the resin film 11 is placed on the lower main body 31 so as to cover the front surface 2 of the substrate 1, so that the opening of the lower main body 31 is closed by the resin film 11. Next, the upper main body 32 is lowered, and the upper main body 32 is mounted on the lower main body 31 with the resin film 11 interposed therebetween.

Next, in the resin film adhering step 201, the exhaust unit 36 is actuated such that the space 33-1 defined by the lower main body 31 and the resin film 11 is decompressed, while the exhaust unit 38 is actuated such that the space 33-2 defined by the upper main body 32 and the resin film 11 is decompressed. Next, after the exhaust unit 38 is stopped, the space 33-2 is opened to the atmosphere. Accordingly, a pressure difference rapidly occurring between the upper and lower sides of the resin film 11 causes the resin film 11 to adhere to the front surface 2 of the substrate 1 such that the resin film 11 conforms to the recesses and projections on the front surface 2 of the substrate 1, as depicted in FIG. 8.

In the resin film adhering step 201, before or after the space 33-2 is decompressed, when heated gas is supplied to the space 33-2, the resin film 11 may be heated. Alternatively, in the resin film adhering step 201, when the heat source provided in the chuck table 34 heats the holding surface of the chuck table 34, the resin film 11 may be heated through the substrate 1. Since the resin film 11 is softened as a result of heating, the resin film 11 follows the recesses and projections on the front surface 2 of the substrate 1 easily, and thus, the resin film 11 can adhere to the front surface 2 of the substrate 1 more easily. After the resin film 11 adheres to the substrate 1, the exhaust unit 36 is stopped, and the upper main body 32 is raised. The substrate 1 to which the resin film 11 adheres is transferred to the support table 40 by the linear motion transfer unit 130.

Note that, before the substrate 1 to which the resin film 11 adheres is transferred to the support table 40, the pressing surface 61 of the pressing unit 60 is assumed to hold the cover film 14 thereon in advance. More specifically, after one of the cover films 14 is pulled out from the cover film supplying unit 66 onto the support table 40 that has not supported the substrate 1 yet, the pressing portion 65 is lowered such that the pressing surface 61 is brought into contact with the upper surface of the cover film 14, the pressing surface 61 holds the cover film 14. After the pressing surface 61 holds the cover film 14, the pressing portion 65 is raised again before the substrate 1 is transferred to the support table 40.

The substrate supporting step 202 is a step of supporting the substrate 1 on the support table 40 depicted in FIG. 4 in a state in which the resin film 11 adhering to the substrate 1 is exposed upward. The support table 40 in the embodiment includes the annular bank region 42 having a height not exceeding the thickness of the substrate 1 and accommodating the substrate 1 inside.

In the substrate supporting step 202, the supporting surface 41 inside the bank region 42 supports the substrate 1. At this time, the upper surface 43 of the bank region 42 supports the portion of the resin film 11 covering the substrate 1 outside the peripheral edge 9 of the substrate 1.

The liquid resin supplying step 203 is a step of supplying the curable liquid resin 13 on the upper surface 12 of the resin film 11 adhering to the substrate 1 supported on the support table 40. The liquid resin supplying step 203 in the embodiment is carried out by the liquid resin supplying unit 50 depicted in FIG. 4.

In the liquid resin supplying step 203, first, the shaft portion 51 of the liquid resin supplying unit 50 is rotated, so that the nozzle 53 is positioned to a position above the center of the support table 40. Next, the liquid resin 13 is supplied onto the front surface 2 of the substrate 1 from the nozzle 53 of the liquid resin supplying unit 50. After a predetermined amount of the liquid resin 13 is supplied, the shaft portion 51 is rotated again, and the nozzle 53 is positioned at a position not overlapping with a range above the support table 40.

The resin pressing step 204 is a step of covering the liquid resin 13 supplied to the resin film 11 with the cover film 14, pressing the cover film 14 by the flat pressing surface 61, and spreading the liquid resin 13 over the resin film 11. The resin pressing step 204 in the embodiment is carried out by the pressing unit 60 depicted in FIG. 5 and FIG. 6.

In the resin pressing step 204, the pressing portion 65 is lowered, and accordingly, the liquid resin 13 is pressed from above through the cover film 14 by the pressing surface 61 holding the cover film 14 thereon. As a result, the liquid resin 13 is pressed and spread out toward the peripheral edge

9 of the substrate 1. More specifically, the liquid resin 13 flows toward the peripheral edge 9 of the substrate 1 between the cover film 14 held by the flat pressing surface 61 and the resin film 11 adhering to the front surface 2 of the substrate 1 along the recesses and projections (bumps 8) on the front surface 2 side of the substrate 1.

In the resin pressing step 204 of the embodiment, the upper surface 43 of the bank region 42 of the support table 40 supports the portion of the resin film 11 which portion is located outside the peripheral edge 9 of the substrate 1. Hence, flowing-out, from the substrate 1, of the liquid resin 13 to be pressed and spread is prevented. When the liquid resin 13 is pressed and spread so as to cover the whole region of the front surface 2 of the substrate 1, the resin pressing step 204 ends, and the curing step 205 is carried out.

Figure 9:
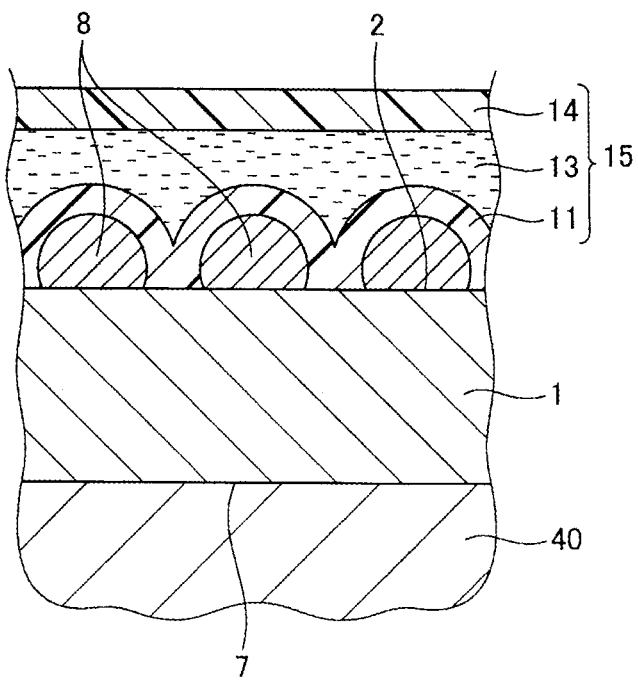
FIG. 9 is an enlarged view schematically depicting the cross-section of the substrate that has undergone a curing step indicated in FIG. 7.

FIG. 9 is an enlarged view schematically depicting the cross-section of the substrate 1 that has undergone the curing step 205 indicated in FIG. 7. The curing step 205 is a step of curing the liquid resin 13 that has been spread after being pressed in the resin pressing step 204, and of forming the protective member 15 including the resin film 11, the cured liquid resin 13, and the cover film 14 on the front surface 2 of the substrate 1. The curing step 205 in the embodiment is carried out by the curing unit 70.

In the curing step 205, in a state in which the vertical movement of the pressing portion 65 that has been lowered in the resin pressing step 204 is stopped, the curing unit 70 applies the ultraviolet rays passing through the pressing surface 61 and the cover film 14 to the liquid resin 13, thereby curing the liquid resin 13.

After the curing step 205 is carried out, when the curing unit 70 is stopped and the pressing portion 65 is raised, as depicted in FIG. 9, the cover film 14 remains on the cured liquid resin 13. More specifically, the protective member 15 obtained by integrating the resin film 11, the cured liquid resin 13, and the cover film 14 is formed on the front surface 2 of the substrate 1. The supporting surface 41 of the support table 40 and the pressing surface 61 of the pressing unit 60 are parallel to each other, and accordingly, the back surface 7 of the substrate 1 and the upper surface of the protective member 15 are parallel to each other.

As described above, in the protective member forming apparatus 20 and the method of forming the protective member 15 according to the embodiment, the support table 40 supporting the substrate 1 includes the bank region 42 surrounding the substrate 1. The upper surface 43 of the bank region 42 supports the portion of the resin film 11 covering the substrate 1 which portion is located outside the peripheral edge 9 of the substrate 1. Accordingly, when the liquid resin 13 on the resin film 11 is pressed and spread, the flowing-out of the liquid resin 13 from the substrate 1 can be prevented.

Note that the present invention is not limited to the embodiment described above. In other words, various changes and modifications may be made without departing from the scope of the invention.

(First Modification)

Figure 10:
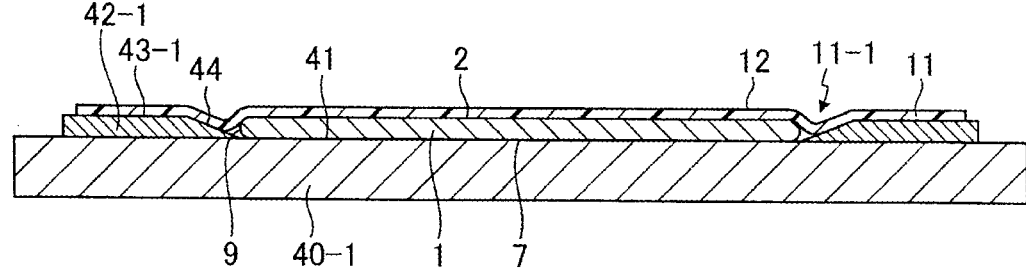
FIG. 10 is a cross-sectional view schematically depicting a support table according to a first modification.

For example, the bank region 42 of the support table 40 is not limited to a shape described in the embodiment. FIG. 10 is a cross-sectional view schematically depicting a support table 40-1 according to a first modification. A bank region 42-1 has an upper surface 43-1 at least higher than the supporting surface 41 and having a height not exceeding the thickness of the substrate 1, as with the embodiment. The upper surface 43-1 of the bank region 42-1 is lower than the height of the substrate 1 supported by the support table 40, in the modification. More specifically, in the modification, the bank region 42-1 has the upper surface 43-1 having a height smaller than the thickness of the substrate 1 and having a height smaller than the thickness of the substrate 1 by several hundred micrometers. The support table 40-1 in the modification has the bank region 42-1 having an inclined surface 44 as a portion of the upper surface 43-1 of the bank region 42-1. The inclined surface 44 is formed in such a manner as to be higher from an inner circumference of the bank region 42-1 toward the outer side in the radial direction.

In a case in which the substrate 1 to which the resin film 11 is caused to adhere is supported by the supporting surface 41 of the support table 40-1 in the modification, the portion of the resin film 11 which portion is located outside the peripheral edge 9 of the substrate 1 is supported by the upper surface 43-1 of the bank region 42-1. In this case, a slack 11-1 occurs at a portion of the resin film 11 which portion corresponds to a lower portion of the inclined surface 44 of the bank region 42-1.

When the liquid resin 13 is pressed and spread by the pressing unit 60 on the resin film 11 of the substrate 1 supported by such a support table 40-1, the pressed and spread liquid resin 13 is collected at the lower portion of the bank region 42-1. The liquid resin 13 having a viscosity to a certain degree is likely to remain on the lower portion of the bank region 42-1 and is less likely to flow outside the bank region 42-1. Hence, for example, even if a height of the bank region 42-1 is not substantially equal to the thickness of the substrate 1, specifically, even if the height of the bank region 42-1 is lower than the thickness of the substrate 1, the flowing-out of the liquid resin 13 can be prevented. Note that it is sufficient if the height of the upper surface 43-1 of the bank region 42-1 having the inclined surface 44 may be height not exceeding the thickness of the substrate 1, and in the present invention, in terms of the design, the height of the upper surface 43-1 may be the same as the height (thickness) of the substrate 1 supported by the support table 40.

(Second Modification)

Figure 11:
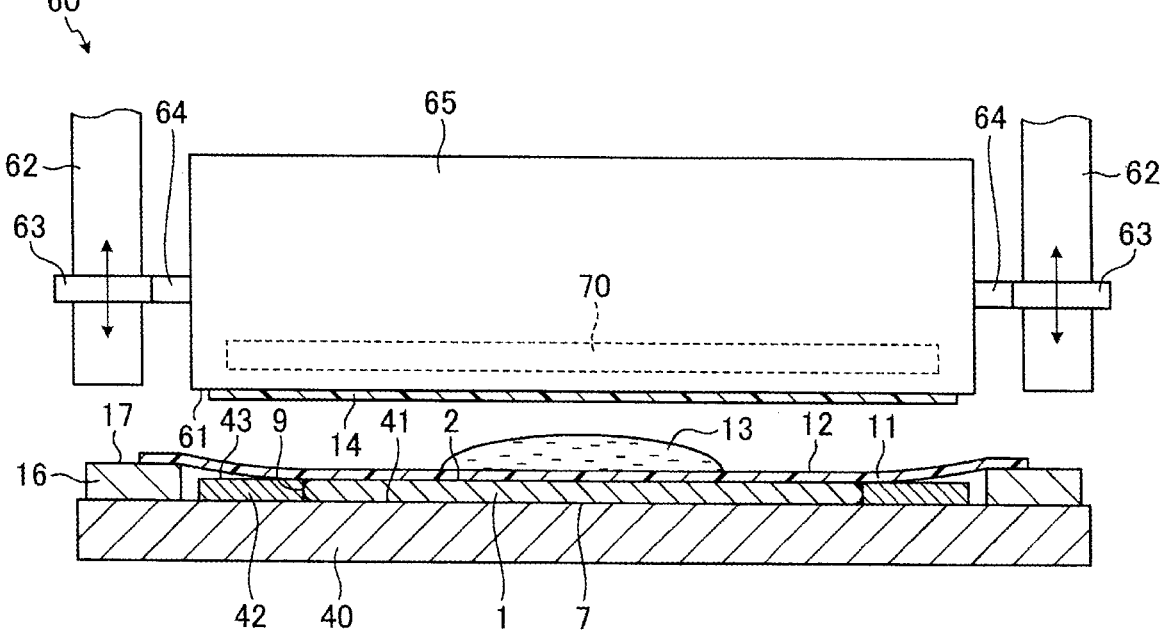
FIG. 11 is a cross-sectional view schematically depicting a state of a resin pressing step according to a second modification.

In addition, for example, the resin film 11 may be fixed to the annular frame 16 by thermocompression bonding. FIG. 11 is a cross-sectional view schematically depicting a state of the resin pressing step 204 according to a second modification. The annular frame 16 has an opening larger in diameter than the outer diameter of the bank region 42. In addition, a thickness of the frame 16 is larger than the height of the bank region 42. The frame 16 is formed of a material such as metal or resin. The outer periphery of the resin film 11 is fixed to the upper surface 17 side of the frame 16 by thermocompression bonding.

The substrate 1 is positioned to a predetermined position of the opening of the frame 16, and by the resin film adhering unit 30, the front surface 2 of the substrate 1 is caused to adhere to the resin film 11, so that the substrate 1 is fixed to the frame 16. In a case in which the resin film 11 is fixed to the frame 16 by thermocompression bonding, the substrate 1 adhering to the resin film 11 is transferred to the support table 40, together with the frame 16.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective member forming apparatus that forms a protective member on a front surface of a substrate, the substrate having recesses and projections formed by a plu-rality of bumps mounted on a plurality of devices formed on the front surface thereof, the protective member forming apparatus comprising:

a resin film adhering unit including an upper space defined by an upper main body and an upper surface of a resin film and a lower space defined by a portion of a lower surface of the resin film and a lower main body, wherein the upper space and the lower space are decompressed and then the upper space is opened to atmosphere to cause the resin film to adhere to the front surface of the substrate so as to conform to and cover the recesses, projections and the plurality of devices on the front surface of the substrate;

a support table which supports the substrate in a state in which the resin film adhering to the substrate is exposed upward;

a liquid resin supplying unit which supplies a curable liquid resin directly onto an upper surface of the resin film facing upward and covering the recesses, the projections and the plurality of the devices formed on the substrate supported on the support table;

a pressing unit which has a flat pressing surface, covers the liquid resin supplied to the upper surface of the resin film with a cover film, and presses the cover film downward by the pressing surface, to spread the liquid resin over the upper surface of the resin film; and a curing unit which cures the liquid resin being spread by the pressing unit, and forms a protective member including the resin film, the cured liquid resin, and the cover film on the front surface of the substrate, wherein the support table includes an annular bank region having a height not exceeding a thickness of the substrate and housing the substrate therein, the bank region prevent-ing the liquid resin to be spread by the pressing unit from flowing out from the substrate.

2. The protective member forming apparatus according to claim 1, wherein the bank region includes an inclined surface on an upper surface thereof, the inclined surface being higher from an inner periphery of the bank region toward an outer side thereof in a radial direction.

3. A method of forming a protective member that forms a protective member on a front surface of a substrate, the substrate having recesses and projections formed by a plu-rality of bumps mounted on a plurality of devices formed on the front surface thereof, the method comprising:

a resin film adhering step of forming an upper space defined by an upper main body and an upper surface of a resin film and a lower space defined by a portion of a lower surface of the resin film and a lower main body, wherein the upper space and the lower space are decompressed and then the upper space is opened to atmosphere to cause the resin film to adhere to the front surface of the substrate so as to conform to and cover the recesses, projections and the plurality of devices on the front surface of the substrate;

a substrate supporting step of supporting the substrate on a support table in a state in which the resin film adhering to the substrate is exposed upward;

a liquid resin supplying step of supplying a curable liquid resin directly onto an upper surface of the resin film facing upward and covering the recesses, the projec-tions and the plurality of the devices formed on the substrate supported on the support table;

a resin pressing step of covering the liquid resin supplied to the upper surface of the resin film with a cover film, and pressing the cover film downward by a flat pressing surface, to spread the liquid resin over the upper surface of the resin film; and a curing step of curing the liquid resin being spread in the resin pressing step, and forming a protective member including the resin film, the cured liquid resin, and the cover film on the front surface of the substrate, wherein, in the substrate supporting step, the substrate is supported on the support table which includes an annular bank region having a height not exceeding a thickness of the substrate and housing the substrate therein, causing the bank region to prevent the liquid resin to be spread in the resin pressing step from flowing out from the substrate.

4. The protective member forming apparatus according to claim 1, wherein the liquid resin supplying unit includes a rotatable arm portion and a nozzle provided at a distal end of the arm portion and oriented downward toward the upper surface of the resin film.

\* \* \* \* \*